(12) United States Patent
Zhu et al.

(10) Patent No.: US 6,777,979 B1
(45) Date of Patent: Aug. 17, 2004

(54) FIFO MEMORY ARCHITECTURE

(75) Inventors: Jinghui Zhu, San Jose, CA (US); Jin Ni, San Jose, CA (US); Ju Shen, Saratoga, CA (US); Tong-Sheng Wang, Milpitas, CA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 44 days.

(21) Appl. No.: 10/334,642

(22) Filed: Dec. 31, 2002

Related U.S. Application Data

(63) Continuation-in-part of application No. 10/023,226, filed on Dec. 14, 2001, now Pat. No. 6,650,141.

(51) Int. Cl.[7] ............................................. H03K 19/177
(52) U.S. Cl. ............................. 326/41; 326/38; 326/39
(58) Field of Search ............................... 326/37–41, 47, 326/101

(56) References Cited

U.S. PATENT DOCUMENTS

| 6,011,407 A | * | 1/2000 | New ............................ 326/39 |
| 2003/0052709 A1 | * | 3/2003 | Venkata et al. ............... 326/37 |

* cited by examiner

Primary Examiner—Anh Q. Tran
(74) Attorney, Agent, or Firm—MacPherson Kwok Chen & Heid LLP

(57) ABSTRACT

A FIFO coordinates with registers of a programmable semiconductor device, wherein the registers are clocked according to an internal clock and words are written into the FIFO according to a write clock. The FIFO includes a read counter responsive to the internal clock to identify a current read address in the FIFO. At a given cycle of the internal clock, the word stored at the current read address of the FIFO may be registered within the registers of the programmable semiconductor device.

20 Claims, 7 Drawing Sheets

FIFO MEMORY ARCHITECTURE

RELATED U.S. APPLICATION DATA

This application is a continuation-in-part of application Ser. No. 10/023,226, filed Dec. 14th, 2001 now U.S. Pat. No. 6,650,141.

TECHNICAL FIELD

This invention relates generally to FIFO (first-in-first-out) memories, and more particularly to a FIFO memory architecture for use in programmable semiconductor devices such as programmable interconnect devices and programmable logic devices.

BACKGROUND

Programmable interconnect devices permit a user to programmably route signals between pins of the device. For example, Lattice Semiconductor Corp. currently offers a family of programmable interconnect devices having a non-volatile in-system-programmable crossbar switch matrix for programmable switching, interconnect, and jumper functions. In a programmable interconnect device or circuit, each pin is associated with an input/output (I/O) circuit that programmably couples other I/O circuits through a routing structure denoted as a global routing pool (GRP). Another programmable interconnect device is described in "Block Oriented Architecture for a Programmable Interconnect Circuit," U.S. Ser. No. 10/022,464, filed Dec. 14, 2001, the contents of which are incorporated by reference in their entirety. In this programmable interconnect device, the I/O circuits are grouped together in a "block-oriented" architecture that contrasts with a "pin-oriented" architecture for a programmable interconnect device. In a pin-oriented architecture, the routing structure addresses each I/O circuit independently, whereas in a block-oriented architecture, the I/O circuits in a block are not addressed independently by the routing structure. By organizing the I/O circuits into blocks, the routing structure may be arranged in a two-level organization as described in "Multi-Level Routing Structure for a Programmable Interconnect Circuit," U.S. Ser. No. 10/023,053, filed Dec. 14th, 2001, the contents of which are hereby incorporated by reference in their entirety. In addition, the routing structure may be subdivided into a data-path routing structure and a control-path routing structure as described therein.

A programmable interconnect device having a block-oriented architecture and a two-level routing structure as just described may be advantageously used in bus-switching applications. However, because of problems such as skew associated with high-speed parallel data transmission, parallel data is often serialized before transmission and then deserialized on reception using serial transmission protocols such as a low voltage differential signaling protocol (LVDS). To permit the transition between parallel and serial data transmission, serializer/deserializer (SERDES) units are conventionally incorporated at both the transmitting and receiving ends of the serial data stream. Encoded into the serial data stream is a clock signal independent of the device's internal (i.e., system) clock. To accommodate the two asynchronous reading and writing clocks, a first-in-first-out (FIFO) buffer memory (often referred to simply as a FIFO) is required to temporarily store the serial data as it is received. A programmable interconnect circuit providing such serializer/deserializer, clock data recovery, and FIFO capabilities is disclosed in "High Speed Interface for a Programmable Interconnect Circuit, U.S. Ser. No. 10/023, 226, filed Dec. 14, 2001, the contents of which are hereby incorporated by reference in their entirety.

Problems may arise when incorporating a conventional FIFO into a programmable interconnect circuit. In a conventional FIFO, the outputs are registered. However, a programmable interconnect circuit already possesses I/O cells that also register input and output signals to the device. Should the programmable interconnect circuit be routing serialized data using a conventional FIFO, an unnecessary clock cycle would be consumed by the FIFO's output register to provide an output that in turn will be registered by an I/O cell. In addition, a user may want to route serialized data through the programmable interconnect circuit but use an external FIFO to coordinate the asynchronous clocks. However, should the programmable interconnect circuit possess a conventional FIFO, the registering of its outputs would hinder the use of the external FIFO.

Accordingly, there is a need in the art for improved FIFO designs that will address the problems associated in incorporating a conventional FIFO into a programmable interconnect circuit.

SUMMARY

In accordance with one aspect of the invention, a programmable logic device (PLD) include a plurality of N pins and a corresponding plurality of N registers, wherein each register may store a signal coupled from its corresponding pin according to an internal PLD clock. A first-in-first-out (FIFO) memory within the PLD may store words according to an external write clock and retrieve the stored words according to the internal PLD clock. A subset of the registers may be configured to store, according to a given cycle of the internal PLD clock, the current retrieved word from the FIFO memory.

DETAILED DESCRIPTION

Figure 1:
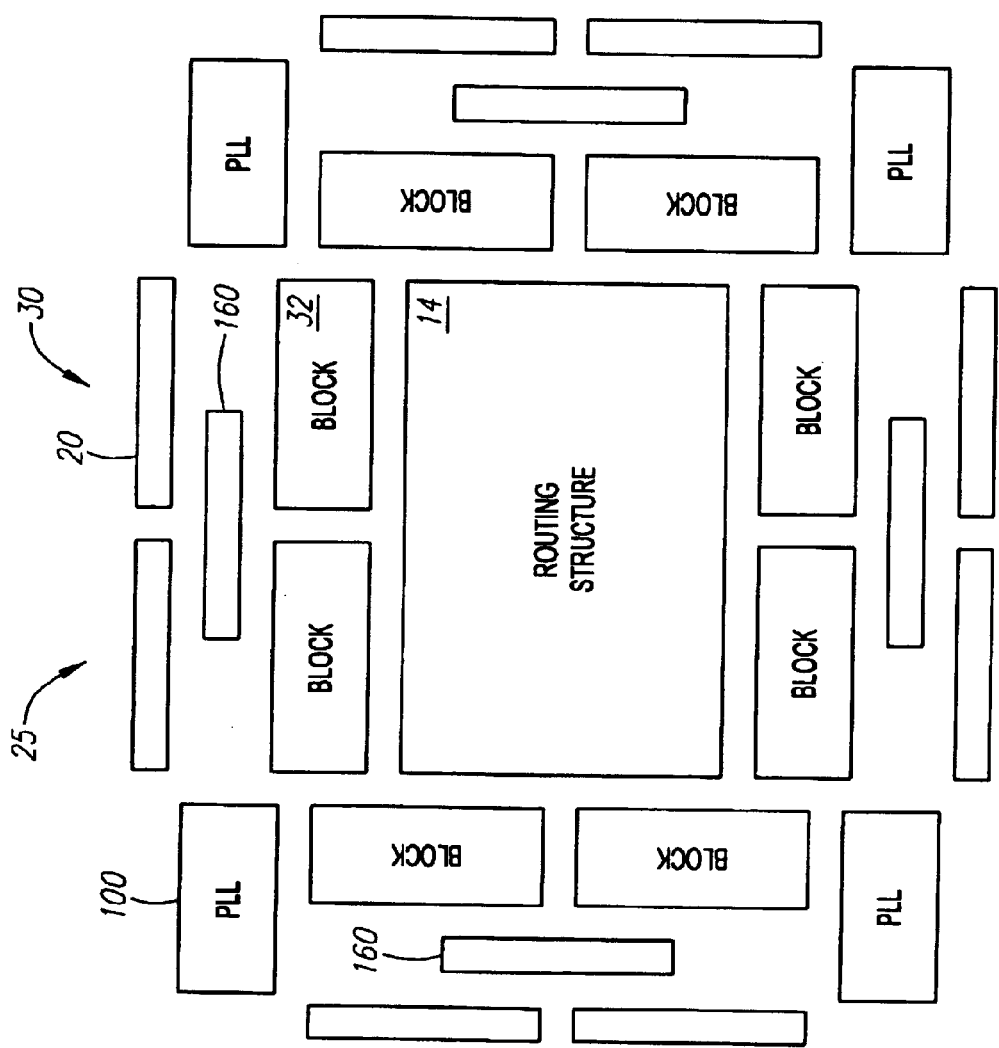
FIG. 1 illustrates a block-oriented programmable interconnect circuit having a plurality of serial interfaces.

The present invention will be described with respect to a programmable interconnect device having a block-oriented programmable interconnect architecture. However, as will be described further herein, the FIFO memory disclosed herein may also be used, for example, in any programmable logic device (PLD) having registered input/output (I/O) cells. Referring now to FIGS. 1 through 4, a programmable interconnect device 25 having a block-oriented programmable interconnect architecture 30 is illustrated. In FIG. 2, each I/O block 32 contains an integer number X of I/O circuits 16 that associate with their own routing structure 15.

Figure 2:
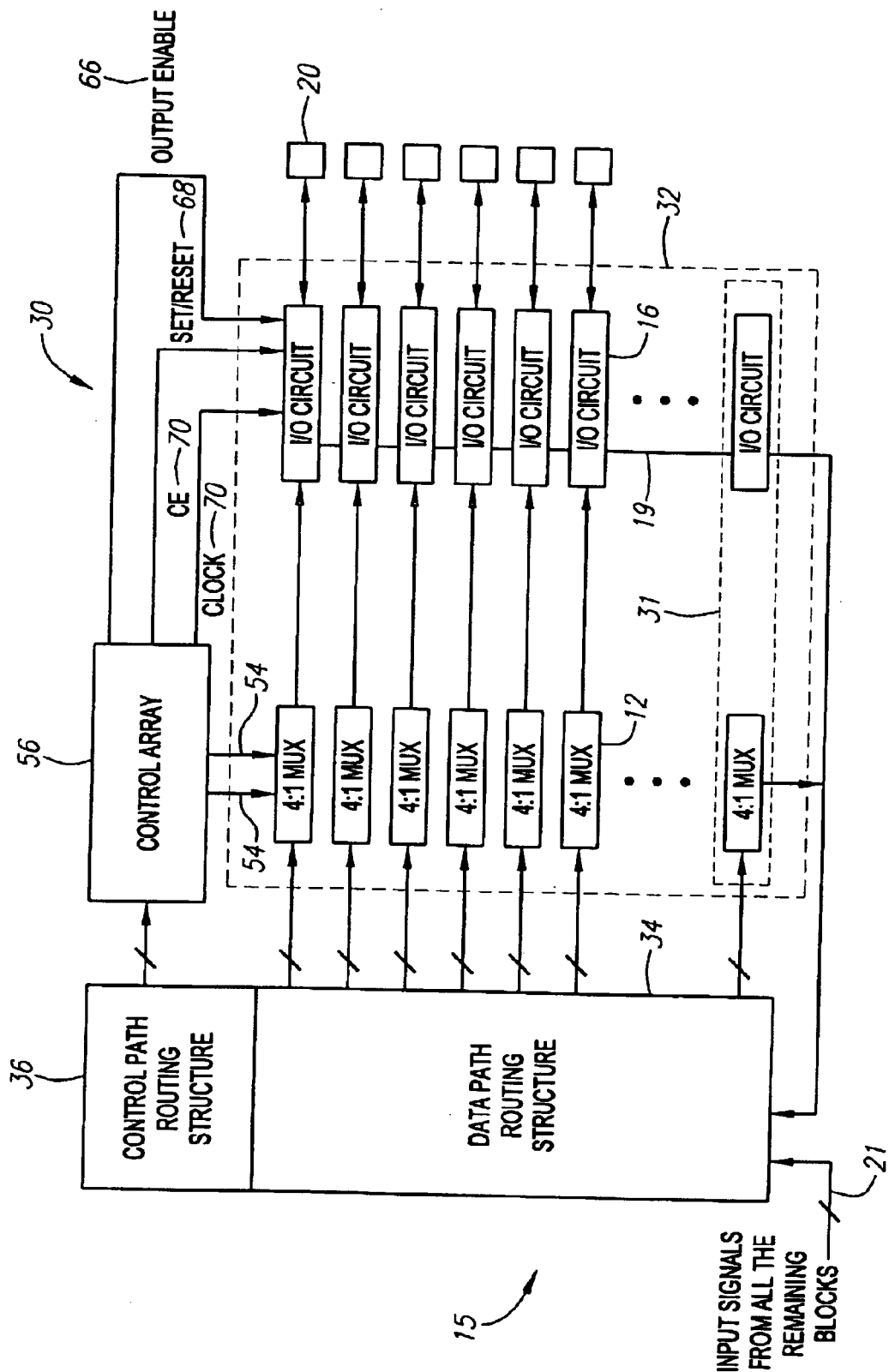
FIG. 2 illustrates the relationship of an I/O block to its serial interface and routing structure.

(In FIG. 1, the routing structures 15 are collectively denoted as a single routing structure 14). In general, integer X is arbitrary as any number of I/O circuits 16 may be assigned to an I/O block 32. However, because bus-switching applications typically route binary signals in groups of 8 (1 byte) or 16 (2 bytes), assigning 16 I/O circuits per I/O block 32 is particularly convenient. Each I/O circuit 16 may be contained with an I/O cell 31, which may also includes a multiplexer such as 4:1 multiplexer 12 for selecting data signal inputs for its I/O circuit 16 (for clarity, only one I/O cell 31 is illustrated in FIG. 2). Referring again to FIG. 2, each I/O circuit 16 may receive input signals from its pin 20. These input signals may comprise data signals that will ultimately be routed to other pins 20 through data path routing structure 34. Alternatively, these input signals may comprise control signals for controlling, for example, 4:1 multiplexers 12 or registers within I/O circuit 16 and are routed through control path routing structure 36.

Each I/O circuit 16 in an I/O block may have an input register, an output register, and an output enable (OE) register (these registers are not illustrated). By separating the input and output registers, true bi-directional input and output capabilities may be achieved. However, the input and output registers may be combined in other embodiments. Having received an input signal from its pin 20, an input register in I/O cell 16 could route the received signal to routing structure 15 on path 19. If the received signal is a data signal it is then routed through data path routing structure 34. Alternatively, if the received signal is a control signal, it is then routed through control path routing structure 36. From these routing structures 34 and 36, the routed signal may be received by another I/O block 32. At the receiving I/O block 32, the received signal may be routed through a multiplexer 12 to an I/O circuit 16. An output register within the receiving I/O circuit 16 may then register the received signal. Depending upon the state of the corresponding output enable register, the registered signal may then be routed outside of programmable interconnect device 25 through the corresponding pin 20.

Each multiplexer 12 is controlled by multiplexer select signals 54 from control array 56. The control signals for each I/O block 32 such as multiplexer select signals 54 and other control signals such as clock and clock enable (CE) 70, set/reset 68 and output enable 66 for the registers within each I/O circuit 16 may be generated by a control array 56. Control array 56 programmably forms product terms from control signals received from control path routing structure 36 to form these control signals. In addition to clock and CE signals 70 from control array 56, the registers in I/O circuit 16 may also select from global clock signals. Accordingly, each register within I/O circuit 16 has a rich resource set of control signals to choose from.

Programmable interconnect device 25 is programmable because of its association with a programmable memory (not illustrated), which is typically non-volatile but may be implemented as a volatile memory if desired. A user may program memory elements within the programmable memory to desired logic levels. These memory elements than control programmable elements such as fuse points, multiplexers, and switches within interconnect device 25 so as to effect a desired mode of operation. The programmable memory is preferably in-system programmable, such that a user may change the programming during operation of the interconnect device.

Figure 3:
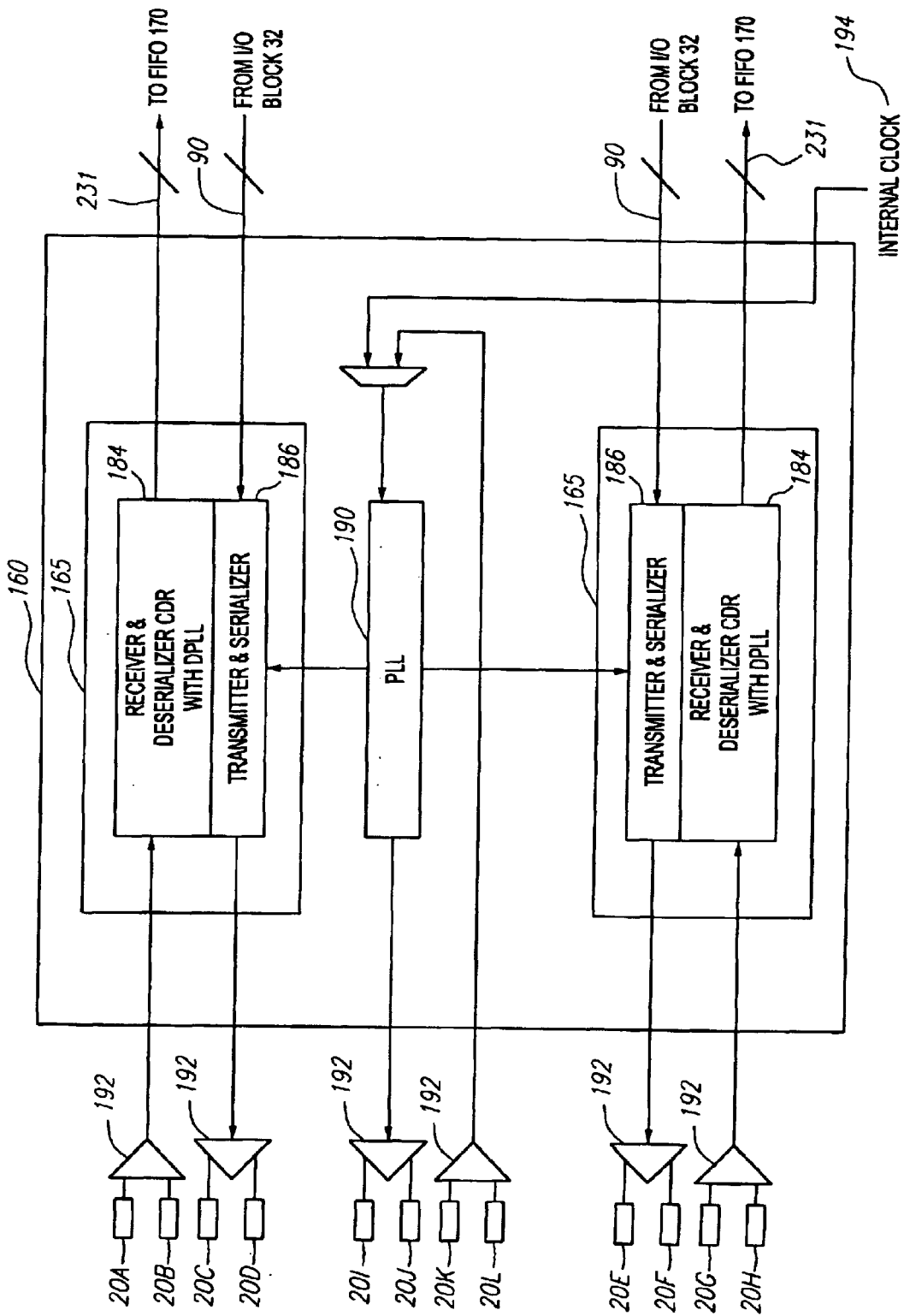
FIG. 3 is a block diagram of a serial interface.

As seen in FIG. 3, a subset of pins 20 for each I/O block 32, for example pins 20a and 20b or pins 20g and 20h, may receive serial differential data signals such as low-voltage-differential-signaling (LVDS) signals. Other differential signaling standards that may be implemented include LVPECL, NLVDS, and BLVDS. Serial interface unit 160 couples to pins 20a and 20b through a differential signal interface 192 to decode the differential signal and deserialize the decoded data (serial interface unit 160 is shown in FIGS. 1 and 3 but not FIG. 2 for illustration clarity). In the embodiment illustrated in FIGS. 1 and 3, serial interface unit 160 spans 2 I/O blocks 32 so that each spanned I/O block pair 32 may share resources within its serial interface unit 160 to reduce component count. Alternatively, each serial interface unit 160 could span more than two I/O blocks 32 or span just one I/O block 32. If two I/O blocks 32 are spanned, serial interface unit 160 has two SERDES units 165, one for each spanned I/O block 32. Each SERDES unit 165 has a receiver and deserializer unit 184 with clock data recovery in a digital-phase-lock-loop (DPLL) as well as a transmitter and serializing unit 186. An analog phase-locked-loop (PLL) 190 receives an internal clock signal 194 and multiplies internal clock signal 194 to provide a serial data clock for each transmitter unit 186. Each I/O block 32 can provide a data word (e.g., 8 to 10 bits wide) onto bus 90 for transmission by its serial interface 160. A transmitter and serializer 186 receives the data word, serializes the received data word, and transmits the serialized data word to a differential signal interface 192. Each differential signal interface 192 may receive a serial data stream and convert the received serial data stream into a differential signal for transmission to the appropriate subset of pins 20. Conversely, a differential signal interface 192 may receive a differential signal from the corresponding subset of pins 20 and convert the differential signal into a deserialized data word. Differential signal interface 192 may be implemented as an application specific integrated circuit (ASIC) component. The differential signal interface 192 may be configured to operate according to a desired differential signaling protocol.

Should the deserialized data word data be encoded according to an 8B/10B protocol, it will form a 10 bit codeword. If the serial data stream has a 1 GHz bit rate, the baud rate of the 10 bit codewords would be 100 MHz. An internal clock signal to interconnect device 25 may match this baud rate but will not be phase aligned with it. Thus, serial interface 160 writes the received codewords into FIFO 170. The code words can then be read from the FIFO 170 according to the internal clock signal for interconnect device 25 by a subset of I/O circuits 16 within an I/O block 32. Thus, FIFO 170 accommodates the asynchronicity between the baud rate of the received codewords and the internal clock for programmable interconnect device 25. The subset of I/O circuits 16 is determined by the length of the codeword. For example, if the codeword is 10 bits wide, 10 I/O circuits 16 may store this codeword. Should serial interface unit 160 be acting as a transmitter to transmit serialized data from its I/O block 32, PLL unit 190 within serial interface unit 160 synthesizes the serial data clock from the internal clock signal 194. Because the serial data clock will be in phase with the internal clock signal, a FIFO buffer is unnecessary to coordinate writing data from I/O block 32 to its serial interface unit 160. The differential signal interface 192 may be configured to operate according to a desired differential signaling protocol. Regardless of the particular differential signal protocol implemented, receiver 184 may provide a parallel data stream to its FIFO 170 on bus 231.

Note that a differential signal requires two conductors for its expression. Thus, each transmitter and serializer unit 186 may communicate through its own subset of two I/O pins 20

(such as a subset formed by pins 20c and 20d or the subset formed by pins 20e and 20f). Similarly, each receiver 184 may communicate through its own subset of two I/O pins 20 (such as a subset formed by pins 20a and 20b or the subset formed by pins 20g and 20h). Each receiver 184 may provide a data word to its FIFO 170 upon deserializing the serial data stream received from its differential signal interface 192.

Should differential interface units 192 be configured for operation in an NLVDS protocol, receiver and descrializer 184 need not perform clock data recovery. Instead, a differential serial data clock may be transmitted over a subset of pins, e.g., pins 20k and 20l, to a differential signal interface unit 192, which in turn provides a serial data clock signal to its receivers 184. In an NLVDS transmission, PLL 190 would provide an NLVDS clock signal to a differential signal interface unit 192, which in turn provides an NLVDS differential clock signal to a pin subset, such as pins 20i and 20j. Multiple transmitters 186 or receivers 184 associated with an NLVDS clock signal may assist in the transmission or reception of an n-bit NLVDS data word. During NLVDS operation, the DPPL within receiver and deserializer 184 may be used for board/cable skew cancellation in a calibration mode.

Regardless of the particular differential signal protocol implemented, each receiver 184 may provide a parallel data stream to its FIFO on bus 231. This mode of operation (which may be denoted as the serial mode of operation) differs from that mode (which may be denoted as the parallel mode) employed when I/O circuits 16 within each I/O block 32 communicate lower-speed parallel data directly with their respective pins 20 without involving serial interface 160 as seen in FIG. 2. In the parallel mode, each I/O circuit 16 may store an input signal from its respective pin 20. Similarly, each I/O circuit 16 may transmit an output signal to its respective pin 20 in the parallel mode. However, in the serial mode, an I/O circuit 16 may store a bit that is not from its respective pin 20 but is instead received using, e.g., pins 20a and 20b. Similarly, when serial interface 160 is transmitting serialized differential data from its I/O block's I/O circuits 16 to its I/O block's pins 20, a given I/O circuit 16 will not transmit an output signal to its respective pin 20. Instead, the output differential signal is received at, e.g., pins 20c and 20d. For example, ten I/O circuits 16 could each transmit one bit of a 10-bit word to transmitter 186 over bus 90. Transmitter 186 then serializes the word, presents it to the appropriate differential signal interface 192, which then differentially transmits the word to external devices through, for example, pins 20c and 20d.

Figure 4:
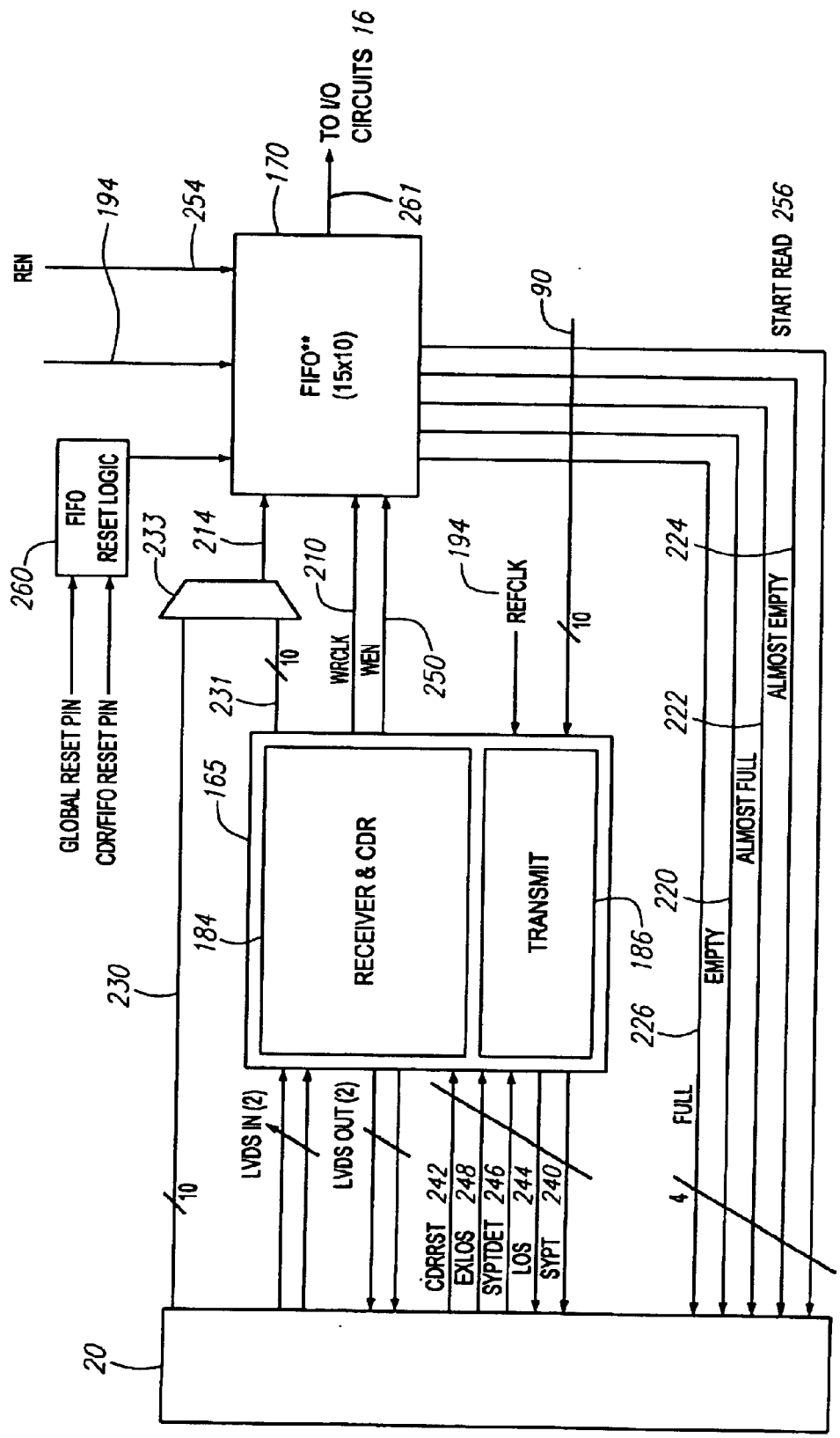
FIG. 4 is a block diagram of a SERDES and FIFO unit according to one embodiment of the invention.

Referring to FIG. 4, FIFO 170 may receive signals in either the serial mode or a parallel-like mode of operation denoted as the generic FIFO mode. In the generic FIFO mode, FIFO 170 receives its input directly from pins 20 such that no deserialization is necessary. For example, if FIFO 170 is configured to store 10 bits words (corresponding to a width of 10 bits), ten pins 20 would provide an input word to FIFO 170 in the generic FIFO mode. Depending upon the mode of operation, a multiplexer 233 selects an appropriate input signal 214 for FIFO 170. In the serial mode, multiplexer 233 selects the signals on bus 231 so that FIFO 170 receives the parallelized data words from receiver 184. In the generic FIFO mode, multiplexer 233 selects the signals on bus 230 so that FIFO 170 receives words directly from pins 20 such that SERDES unit 165 is not involved. In turn, FIFO 170 will provide the received words to input registers in I/O circuits 16 (FIG. 2) on bus 261. Thus, the generic FIFO mode of operation is similar to the parallel mode of operation in that a set of pins 20 will receive a word that will eventually be received by a corresponding set of I/O circuits 16 after routing through FIFO 170.

Proper operation of a SERDES unit 165 with a FIFO 170 requires a number of flags and signals. The flag and signal flow amongst SERDES 165, FIFO 170, and pins 20 is illustrated in FIG. 4. As is known in the art, the CDR unit within receiver 184 must not only identify the bits in its received serial bit stream but also identify the beginning/end of a word within the serial bit stream. For example, the CDR unit may accomplish this identification using pattern recognition techniques. A CDR flag, SYPT 240, is used in 10B/12B LVDS operation in conjunction with this pattern recognition. A CDR reset signal, CDRRST 242, may be used to reset the CDR unit to start a lock in process, regardless of whether LVDS, NLVDS, or BLVDS operation is supported. Another flag, loss of signal (LOS) 244, indicates when receiver 184 loses its signal during 10B/12B LVDS operation. Alternatively, LOS 244 may indicate when receiver 184 loses synchronization during NLVDS operation. Another signal, SYPTDET 246 is optional for 10B/12B LVDS operation. An EXLOS signal 248 originates from an external optic LOS detector (not illustrated) used in NLVDS operation. Finally another signal, CAL (not illustrated) may be used to enable CDR calibration. It will be appreciated that the number and type of CDR flags used may vary and will depend upon design choices known to those skilled in the art. With respect to the embodiment illustrated in FIG. 4, six pins 20 will be dedicated within each I/O block 32 for carrying the just-described flags in the serial mode of operation. In addition, four pins (e.g., pins 20a, 20b, 20c, and 20d of FIG. 3) are dedicated to LVDS input and output differential signals in the serial mode of operation.

Having deserialized the received serial data, each receiver 184 may provide a data word to its FIFO 170. For example, if pins 20a and 20b receive a differential signal encoded using an 8B/10B LVDS protocol, receiver 184 provides a 10-bit word to FIFO 170. FIFO 170 allows clock synchronization between the serial data clock associated with the LVDS serial data stream and the internal clock rate used by programmable interconnect device 25 to read the received data. Thus, FIFO 170 need not be large and may be implemented as a 15 deep, 10-bit wide (or wider) FIFO. Because of its clock synchronization function, FIFO 170 may be implemented as a simple "Circular Queue" in a round-robin fashion with two separate clocks, a read clock and a write clock. A FIFO 170 that stores 15 words deep by 10 bits wide can support 8B/10B or 10B/12B LVDS protocols as well as an NLVDS protocol. Depending upon the programming of programmable interconnect device 25, each FIFO 170 may operate in three different modes:

1) Serial Mode Operation. In this above-described mode, a differentially encoded serial signal is received by receiver 184, decoded, and presented to FIFO 170 through multiplexer 233.

2) Generic FIFO Operation. In this above-described mode, LVDS capability is bypassed. FIFO 170 couples to pins 20 directly through multiplexer 233 as explained herein.

3) Flow-Through or by-pass mode. In this mode, LVDS CDR functionality may or may not be used but the FIFO 170 acts as a flow-through device for the parallel data stream resulting from receiver 184 or pins 20.

Should FIFO 170 be used in either of the first two modes, FIFO flags assist in its operation. An empty flag 220 goes true when FIFO 170 stores no data. A full flag 226 goes true when FIFO 170 is full. An almost full flag 222 goes true when FIFO 170 has only a single word location empty. An almost empty flag 224 goes true when FIFO 170 stores only a single word. An additional flag, start read 256 is associated with CDR operation.

In serial mode operation, receiver 184 provides a write enable signal 250 and a write clock 210 to FIFO 170 based upon the recovered serial clock. Assuming words are thus written into FIFO 170 and the flag condition permitting, the resulting words may be read by programmable interconnect device 25 according to the internal clock 194 and a read enable signal 254. Internal clock 194 is the same clock signal as that chosen to drive the input registers within the I/O circuits 16 that store words retrieved from FIFO 170. FIFO 170 may be reset according to an output from FIFO reset logic block 260.

Figure 5:
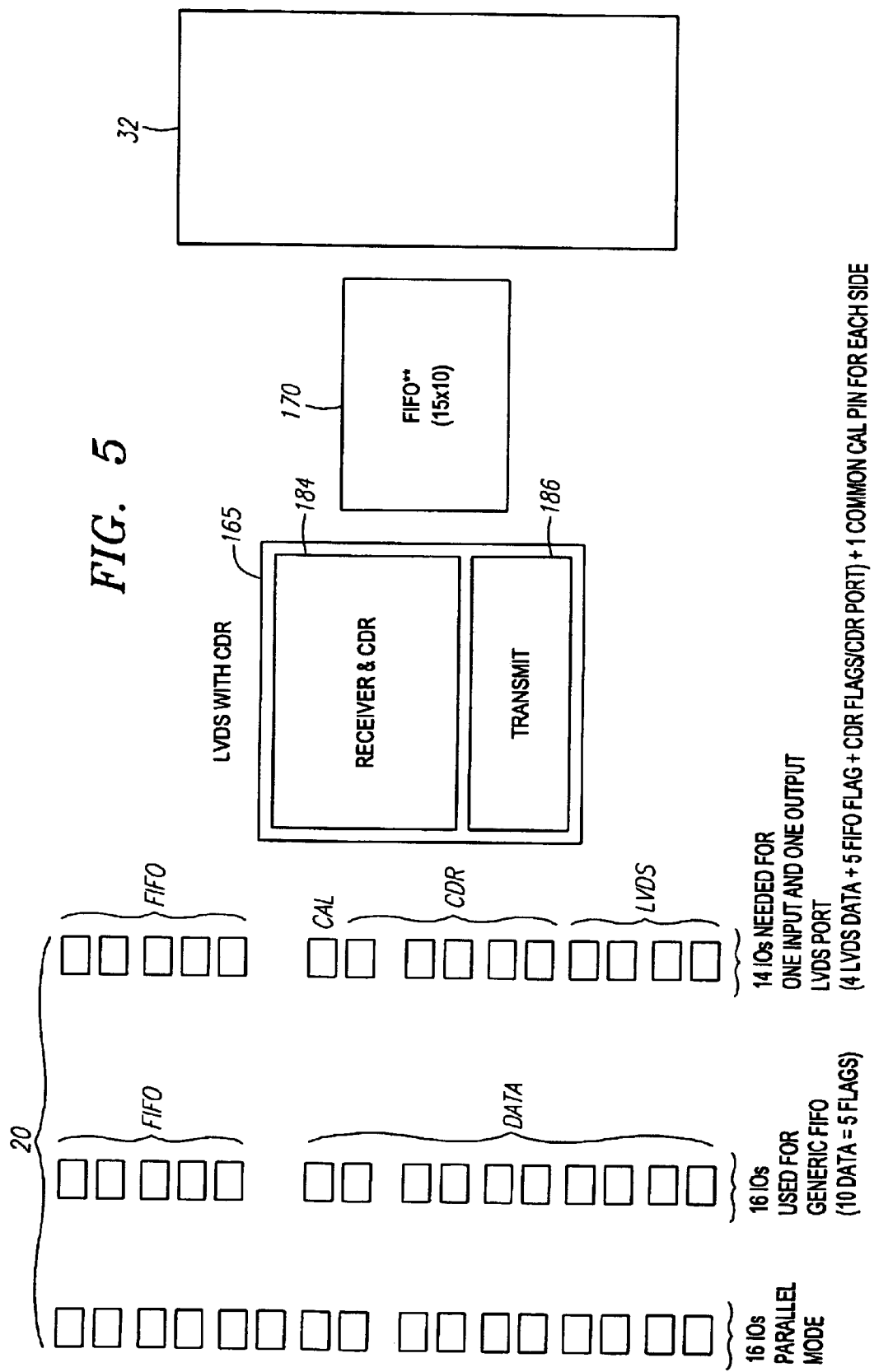
FIG. 5 illustrates the relationship between an I/O block's SERDES and FIFO unit and its I/O pins according to one embodiment of the invention.

Referring now to FIG. 5, exemplary pin assignments for an I/O block 32 having sixteen I/O circuits (not illustrated) and thus sixteen pins 20 are shown. In the parallel mode of operation, all sixteen pins 20 communicate with their respective I/O circuit 16 in I/O block 32 as discussed with respect to FIG. 2. In this mode of operation, the I/O block's SERDES unit 165 and FIFO 170 are bypassed. In the generic FIFO mode of operation, five pins 20 are used to carry the above-described FIFO flags 226, 220, 222, 224, and 256 (FIG. 4). Assuming a 10-bit wide FIFO 170, ten pins 20 receive a 10-bit data word and couple the data word over bus 230 (FIG. 4) to bypass SERDES 165 and reach FIFO 170. Thus, fifteen pins 20 may be assigned in a generic FIFO mode. Finally, in the serial mode, eleven pins carry signals 242, 248, 246, 244, 240, 226, 220, 222, 224, and 256 (FIG. 4) and a calibration signal CAL (used only in NLVDS mode and not illustrated). Four pins 20 would be dedicated to input and output differential LVDS signals. Thus, fifteen pins may also be assigned in the serial mode. Before data can be transmitted or received by SERDES 165, both receiver 184 and transmitter 186 should be initialized. This initialization includes synchronization of the serializer in transmitter 186 and the DPLL in receiver 184 to the internal clock signal 194 (FIG. 4).

Figure 6:
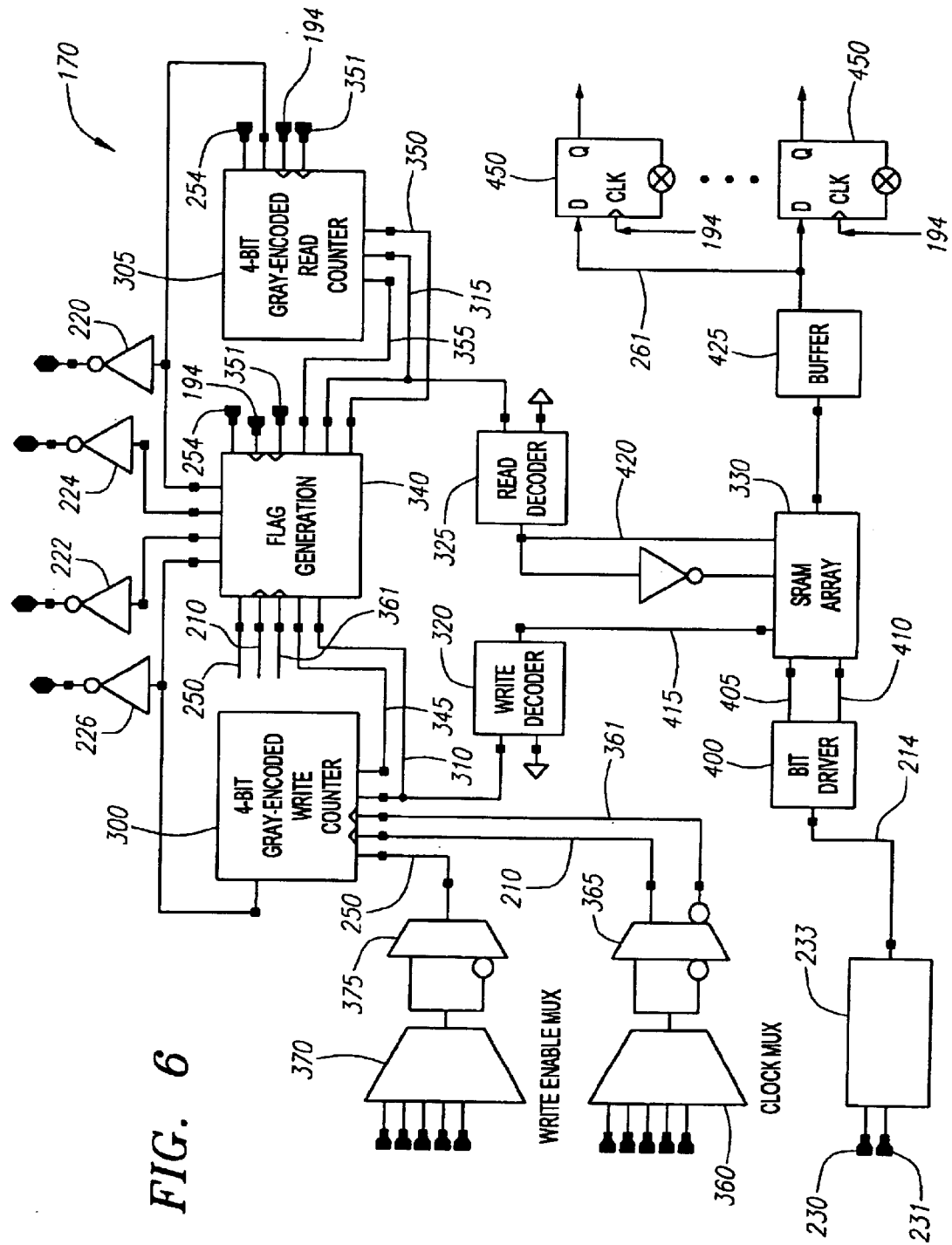
FIG. 6 is a block diagram of a FIFO memory according to one embodiment of the invention.

Turning now to FIG. 6, an exemplary block diagram for FIFO 170 is illustrated. By gray-encoding write counter 300 and read counter 305, write count 310 and read count 315 prevent glitches in corresponding write decoder 320 and read decoder 325, respectively. At each cycle of write clock 210, write counter 300 increments write count 310 and next write count 345 accordingly. Similarly, at each cycle of internal clock 194, read counter 305 increments read count 315, next read count 355, and last read count 350 accordingly. Assuming SRAM array 330 is just 16 words deep, write counter 300 and read counter 305 need only be 4-bit counters. Flag generation module 340 receives write count 310, next write count 345, read count 315, last read count 350, and next read count 355 to generate full flag 226, almost full flag 222, empty flag 220, and almost empty flag 224 responsive to write clock 210, its inverse 361, write enable 210, internal clock 194, its inverse 351, and read enable 254.

Read counter 305 receives internal clock 194 and its inverse 351. Read counter 204 also receives read enable signal 254. Internal clock 194 is the same clock signal selected for the input registers 450 in I/O circuits 16 that will receive the FIFO output carried on bus 261. It may be a global clock signal or a clock signal 70 received from control array 56 (FIG. 2). A clock multiplexer 360 selects between global clock signals and an LVDS clock signal to provide an output to polarity selection multiplexer 365, which in turn forms write clock 210 and write clock inverse 361. Similarly, a write enable multiplexer 370 selects from global write enable signals and provides an output to a polarity selection multiplexer 375, which in turn forms write enable 250.

Flag generation module 340 may receive write clock 210, write clock inverse 361, write enable 210, internal clock 194, internal clock inverse 351, and read enable 254 to assist in the generation of the flags. For example, flag generation module 340 may be configured to generate full flag 226 synchronously with the rising edge of write clock 210. Thus, if full flag 226 goes true and data subsequently be read from SRAM array 330, full flag 226 will not be reset until the next rising edge of write clock 210. Should full flag 226 become true, write counter 300 stops operation. Similarly, empty flag 220 may be synchronous with the rising edge of internal clock 194. Thus, if empty flag goes true and data is subsequently written to SRAM array 330, empty flag 220 would not be reset until the next rising edge of internal clock 194. If empty flag 220 becomes true, read counter 305 stops operation. Because SRAM 330 may be quite small (for example, 16 words deep), almost empty flag 224 and almost full flag 222 may be of limited value in the generic FIFO mode. Both read counter 305 and write counter 300 reset in response to a reset command from reset logic module 260 (FIG. 4).

As described with respect to FIG. 4, data multiplexer 233 selects between an LVDS input on bus 231 or a generic FIFO input on bus 230 as described previously to provide a FIFO input signal 214. Bit driver 400 receives FIFO input signal 214 and forms FIFO input 405 and its inverse 410. The width of SRAM array 330 should be sized to accommodate the width of LVDS-decoded data words in the serial mode operation and the width of directly-coupled data words in the generic FIFO mode operation. For example, SRAM array 330 may be 18-bits wide. Accordingly, FIFO input 405 and its inverse 410 would each be 18-bits wide for such an embodiment. Received data words are written into SRAM array 330 at the decoded address 415 provided by write decoder 320. Similarly, programmable interconnect device 25 reads stored data words at the decoded address 420 provided by read decoder 325. The resulting FIFO output may be buffered in buffer stage 425 before being received by registers 450 through bus 261.

Note that at any given cycle of internal clock 194, the current read count is incremented by read counter 305 and decoded by read decoder 325 to identify a decoded address 420. At the subsequent cycle of internal clock 194, the word stored at the decoded address 420 corresponding to the given cycle of internal clock 194 is stored by input registers 450. In this fashion, input registers 450 act as the output register stage for a conventional FIFO memory. However, consider the advantages provided by a FIFO memory of the present invention such as FIFO memory 170 of FIG. 6. As discussed herein, programmable interconnect device 25 (FIG. 1) provides a rich set of resources such as multiple clock signals for input register 450 within I/O circuits 16. FIFO 170 permits the use of input registers 450 to function as FIFO output registers rather than using a conventional FIFO register output stage such as is known in the art with respect to conventional FIFO memory design. In this fashion, unnecessary register components are avoided. Moreover, suppose a user wishes to use an external FIFO (not illustrated) with programmable interconnect device 25. In such a "flow-through" mode, programmable interconnect device 25 acts to couple signals from one subset of its pins 20 to another without the delay associated with clocking in the signals into internal registers. In the flow-through mode, input registers 450 of the relevant I/O circuits are configured to act as latches rather than D-type flip-flops. The write counter 300 and read counter 305 are configured to hold constant the current write count 310 and the current read count 315. Accordingly, words are stored into and retrieved from the same address during the flow-through mode, e.g., address 0. Thus, with respect to the stored and retrieved words during the flow-through mode, SRAM array 330 also acts as a latch. The write clock 210 is coupled to the external FIFO which can then operate to store words retrieved from SRAM array 330 without any additional clock delays. For example, programmable interconnect circuit 25 could receive a differential signal on pins 20a and 20b of FIG. 3, perform deserialization and CDR in receiver 184, then route the deserialized data word through FIFO 170 to input registers 450 (configured in latch mode) in the relevant I/O circuits 16 in I/O block 32, and then route the deserialized data word through routing structure 15 to another relevant set of I/O circuits 16 in a different I/O block 32. Output registers (not illustrated) configured in latch mode in these I/O circuits 16 would then receive the routed deserialized data word and present it to the external FIFO (not illustrated) on corresponding pins 20. The external FIFO may then store the received words according to write clock 210. However, if a conventional FIFO were implemented in programmable interconnect device 25 instead of FIFO 170, the output register stage in such a conventional FIFO would prevent this flow-through mode.

Figure 7:
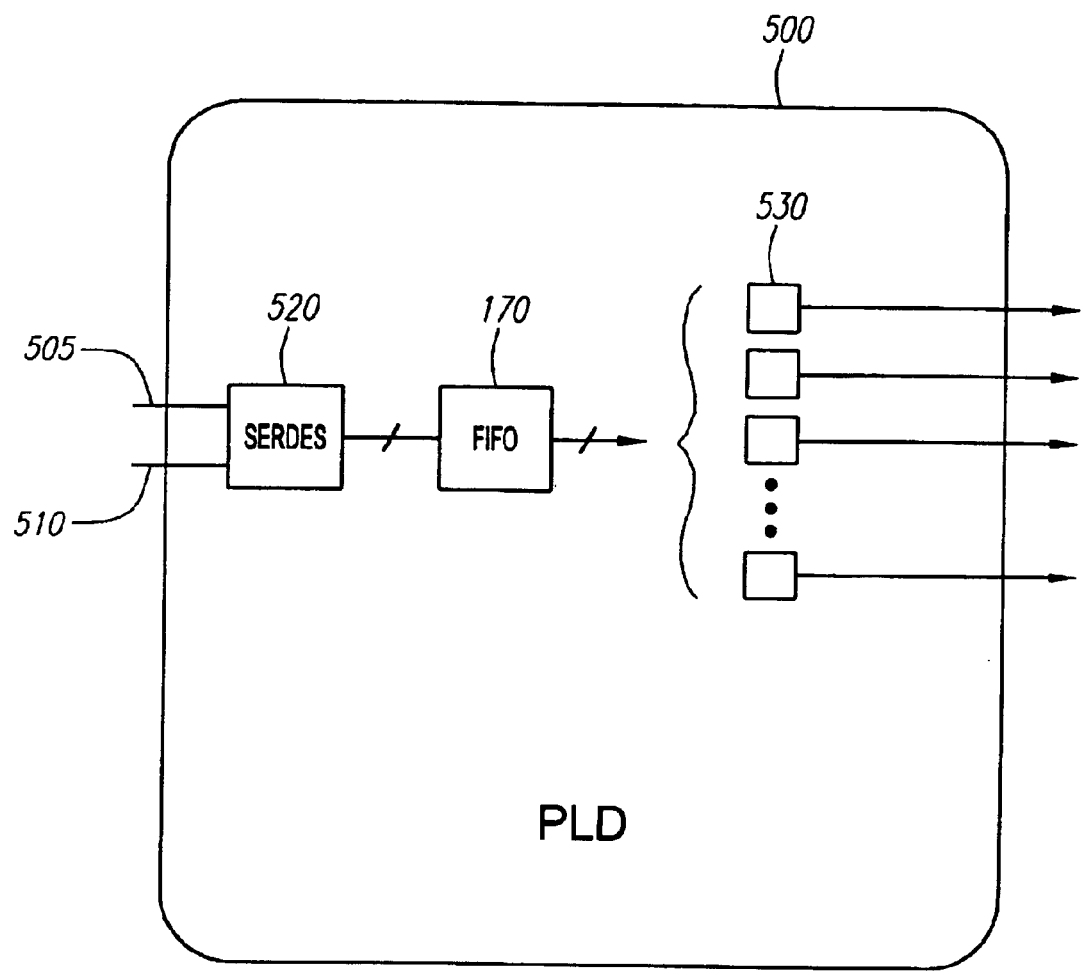
FIG. 7 is a block diagram of a programmable logic device incorporating a FIFO memory according to one embodiment of the invention.

It will be appreciated that the width and depth of FIFO 170 is adjustable as desired by a user. Moreover, the configuration of the various modules within FIFO 170 to perform in serial mode, generic FIFO mode, or flow-through mode may occur through configuration signals (not illustrated) from a memory such as a non-volatile memory that is in-system programmable. Furthermore, although described with respect to programmable interconnect device 25, FIFO 170 is broadly applicable for use in any programmable logic device configured to receive differential signals. For example, FIG. 7 illustrates a programmable logic device (PLD) 500 receiving a differential signal at pins 505 and 510. A SERDES 520 receives the differential signal and provides a deserialized data word to FIFO 170. PLD contains input registers 530 in, for example, macrocells (not illustrated). FIFO 170 coordinates the asynchronicity between the serial clock clock recovered by SERDES 520 and the internal clock used by registers 530 as described with respect to FIG. 6. Should registers 530 be configured as latches, FIFO 170 may be used in a flow-through mode as well. Accordingly, although the invention has been described with respect to particular embodiments, this description is only an example of the invention's application and should not be taken as a limitation. Consequently, the scope of the invention is set forth in the following claims.

We claim:

1. A programmable semiconductor device, comprising:
    a first-in-first-out (FIFO) memory configured to store data words at each cycle of an external write clock and retrieve a stored data word at each cycle of an internal clock,
    a plurality of N pins;
    a plurality of N registers corresponding to the plurality of N pins, wherein each register is configurable to store signals from its corresponding pin according to the internal clock, and wherein a subset of the registers are configurable to, at a given cycle of the internal clock, store the current retrieved word from the FIFO memory.

2. The programmable semiconductor device of claim 1, wherein the FIFO memory further comprises:
    a memory array having a plurality of addresses and configured to store a data word at each address;
    a write counter configured to generate a write count at each cycle of the external write clock;
    a write decoder configured to identify the address in the memory array corresponding to the write count;
    a read counter configured to generate a read count at each cycle of the internal clock; and
    a read decoder configured to identify the address memory array corresponding to the read count, wherein at a given cycle of the internal clock, the FIFO memory retrieves the stored data word at the address identified by the read count in the preceding PLD clock cycle.

3. The programmable semiconductor device of claim 2, wherein the FIFO memory further comprises a FIFO flag generator, the FIFO flag generator configured to compare the read and write counts and generate a full flag and empty flag accordingly, and wherein the write counter is configured to stop counting if the full flag is asserted and the read counter is configured to stop counting if the empty flag is asserted.

4. The programmable semiconductor device of claim 3, wherein the programmable semiconductor device forms a programmable logic device.

5. The programmable logic device of claim 4, wherein the programmable logic device is configured to form a programmable interconnect device for programmably routing signals between pins in the plurality of N pins, and wherein the programmable interconnect device includes an input/output cell corresponding to each pin in the plurality of N pins, and wherein each register is located within an input/output cell of the programmable interconnect device.

6. The programmable logic device of claim 4, wherein the FIFO memory may be configured in a flow-through mode such that the read count and the write count are held constant, the registers are configured to operate in a latch mode, whereby an external FIFO may be coupled to the registers so as to store the retrieved word from the registers according to the external write clock.

7. The programmable semiconductor device of claim 1, further comprising a SERDES, wherein the SERDES is configured to deserialize a differential serial signal to form data words, recover the external write clock from the differential serial signal, and provide the formed data words to the FIFO memory.

8. The programmable semiconductor device of claim 7, wherein the FIFO memory has a serial mode of operation in which it stores the formed data words from the SERDES and wherein the FIFO memory has a generic FIFO mode of operation in which it stores data words coupled directly from a subset of the pins.

9. The programmable semiconductor device of claim 8, wherein the memory array is an SRAM memory array having at least 16 addresses.

10. The programmable semiconductor device of claim 9, wherein the memory array is configured to store words of at least 10 bits at each address.

11. The programmable semiconductor device of claim 2, wherein the write counter is configured to gray encode the write count and wherein the write decoder is configured to decode the gray-encoded write count.

12. The programmable semiconductor device of claim 11, wherein the read counter is configured to gray-encode the read count and wherein the read decoder is configured to decode the gray-encoded read count.

13. A method for using a FIFO memory in a programmable semiconductor device having a plurality of N pins and a corresponding plurality of N registers, wherein each register may store a signal received from its corresponding pin according to an internal clock, comprising:

writing words into the FIFO memory according to an external write clock;

retrieving words from the FIFO memory according to the internal clock; and storing retrieved words from the FIFO memory in a subset of the registers, wherein, at a given cycle of the internal clock, the subset of registers stores the current retrieved word from the FIFO memory.

14. The method of claim 13, further comprising:

generating a gray-encoded write count according to the external write clock, and decoding the gray-encoded write count to identify a current write address within the FIFO memory, wherein at a given cycle of the external write clock, the FIFO memory stores a data word at the current write address.

15. The method of claim 14, further comprising:

generating a gray-encoded read count according to the internal clock, and decoding the gray-encoded read count to identify a current read address within the FIFO memory, wherein at a given cycle of the internal clock, the subset of registers store the data word retrieved from the current read address.

16. The method of claim 15, further comprising:

comparing the current read address and the current write address to determine whether the FIFO is full or empty.

17. The method of claim 16, further comprising:

generating a full flag if the current read address and the current write address are equal.

18. A programmable interconnect device, comprising:

a plurality of N pins;

a plurality of N input/output (I/O) registers corresponding to the plurality of N pins, wherein a given I/O register is coupled to its corresponding pin;

a routing structure coupled to the N input/output registers; and means for storing data words coupled from a subset of the pins according to an external clock and for retrieving the stored data words according to an internal clock of the programmable interconnect device in a first-in-first-out order, wherein a subset of the I/O registers are configurable to register, at a given cycle of the internal clock, the current retrieved data word.

19. The programmable interconnect device of claim 18, wherein the stored data words are ten bit data words.

20. The programmable interconnect device of claim 19, wherein the means may store at least ten data words.

* * * * *